(12) United States Patent
Watts

(10) Patent No.: US 7,484,139 B2
(45) Date of Patent: Jan. 27, 2009

(54) AMPLIFIER FAULT DETECTION CIRCUIT

(75) Inventor: Robert Watts, Carmarthen (GB)

(73) Assignee: Zetex Semiconductors Plc, Chadderton (GB)

( * ) Notice: Subject to any disclaimer, the term of this patent is extended or adjusted under 35 U.S.C. 154(b) by 569 days.

(21) Appl. No.: 11/316,319

(22) Filed: Dec. 22, 2005

(65) Prior Publication Data

US 2006/0195720 A1  Aug. 31, 2006

(30) Foreign Application Priority Data

Dec. 23, 2004  (GB) ............................ 0428211.7

(51) Int. Cl.
- G01R 31/28 (2006.01)
- G06F 7/02 (2006.01)
- H03F 3/26 (2006.01)
- H03F 1/38 (2006.01)
- H03F 1/36 (2006.01)
- H04B 1/10 (2006.01)

(52) U.S. Cl. .................. 714/716; 714/819; 330/265; 330/291; 330/75; 375/254

(58) Field of Classification Search ............... None
See application file for complete search history.

(56) References Cited

U.S. PATENT DOCUMENTS

| | | | |
|---|---|---|---|
| 4,599,571 A * | 7/1986 | Matsuno | 330/11 |
| 5,974,089 A | 10/1999 | Tripathi et al. | |
| 6,300,825 B1 | 10/2001 | Dijkmans et al. | |
| 6,646,501 B1 * | 11/2003 | Wessel | 330/10 |
| 6,987,417 B2 * | 1/2006 | Winter et al. | 330/10 |
| 7,157,969 B2 | 1/2007 | Candy | |
| 2007/0040608 A1 | 2/2007 | Magrath et al. | |

* cited by examiner

*Primary Examiner*—Christine T Tu
(74) *Attorney, Agent, or Firm*—Krieg DeVault LLP; L. Scott Paynter

(57) ABSTRACT

An amplifier (1) adapted to receive an input signal and to generate an output signal at an amplifier output (7) according to the input signal, the amplifier (1) comprising: a feedback circuit arranged to provide a feedback signal indicative of the output signal; an error signal generating circuit (12, 44) arranged to receive the feedback signal and generate a digital error signal according to the feedback signal; and an output signal generating circuit arranged to generate the output signal and to receive the digital error signal and to adjust the output signal according to the digital error signal; the amplifier (1) further comprising: a fault detection circuit (50) arranged to receive the digital error signal and to determine the presence or absence of a fault condition at the amplifier output (7) according to the digital error signal and to provide a signal (54) indicative of the presence or absence of the fault condition.

45 Claims, 4 Drawing Sheets

Figure 1:
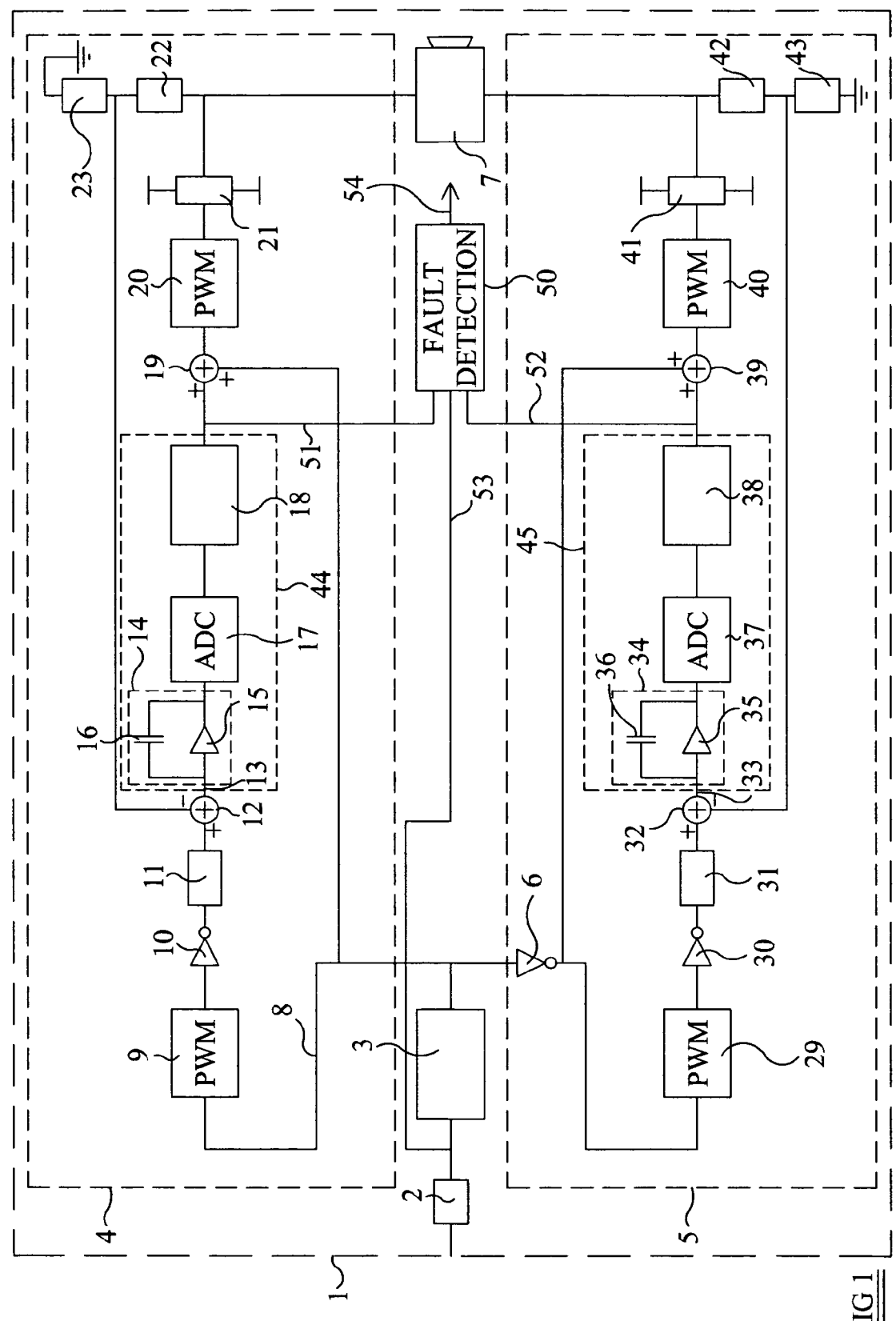

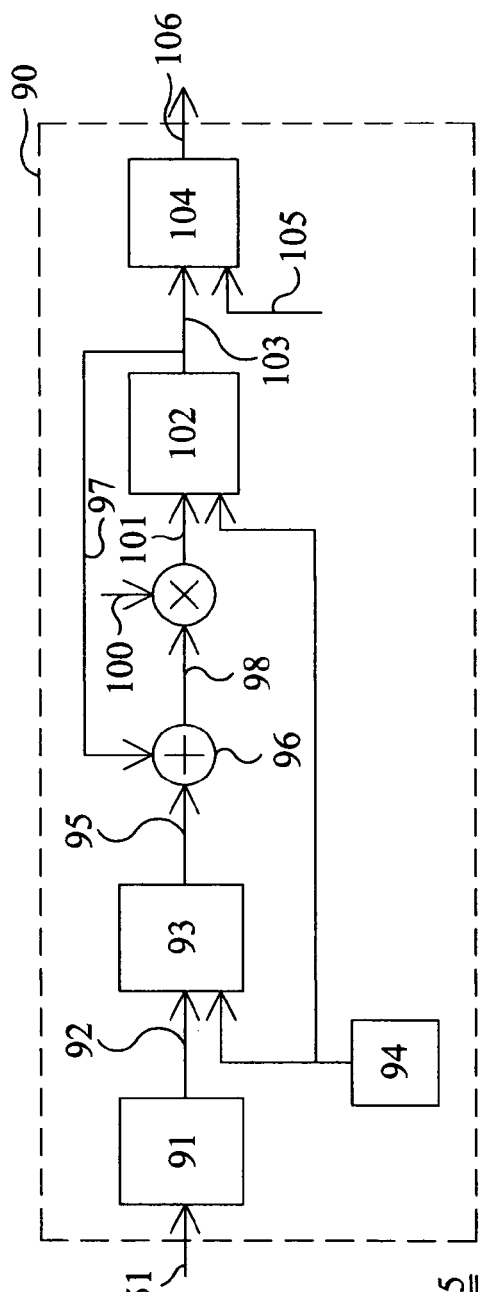
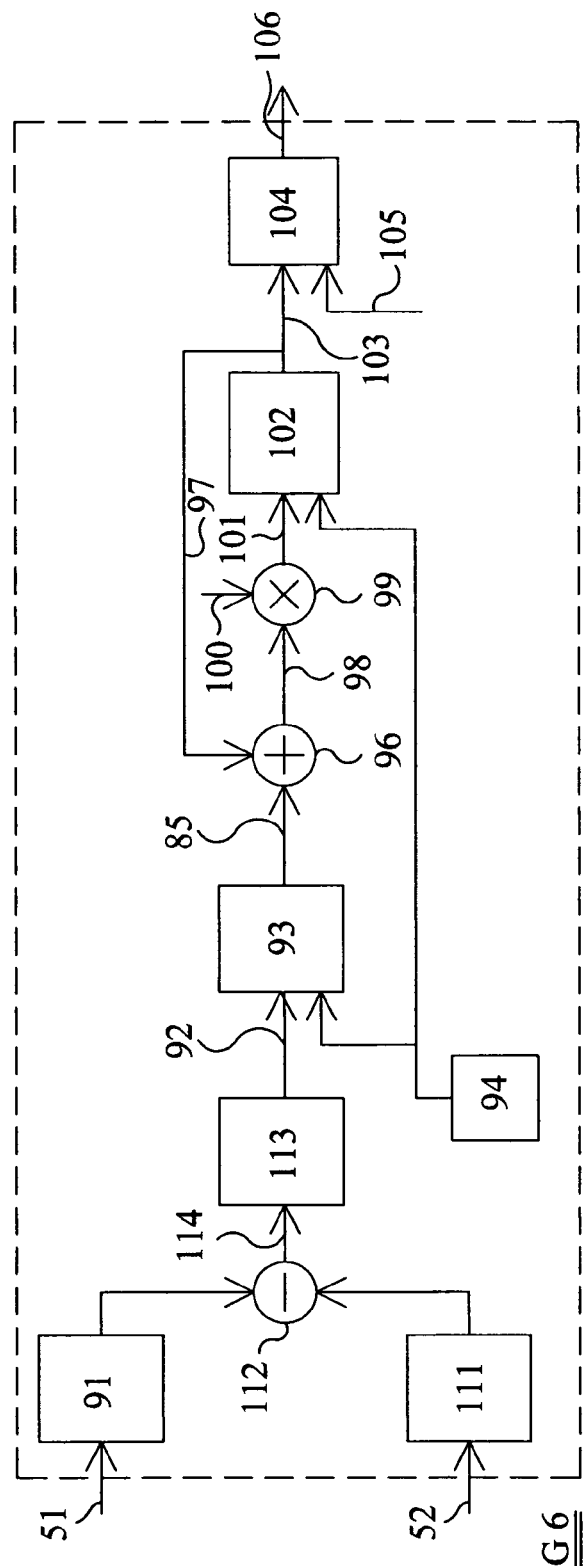

AMPLIFIER FAULT DETECTION CIRCUIT

CROSS-REFERENCE TO RELATED APPLICATIONS

The present application claims priority to British Patent Application No. GB 0428211.7 filed 23 Dec. 2004.

The present invention relates to amplifier fault detection circuits. In particular, although not exclusively, the present invention relates to fault detection and protection circuits for digital amplifiers using feedback to generate a digital error signal that is used to generate an output signal to drive a load.

Digital amplifiers (in the sense of those amplifiers that operate on a digital input) are well known. Such amplifiers commonly incorporate feedback means arranged to feedback a signal from a later stage of the amplifier or the output in order to generate an error signal by comparing this feedback signal with the input to the amplifier or a processed signal (i.e. a signal derived from the input). The error signal may be a digital error signal, or alternatively the error signal may be analog and then digitised via an analog to digital converter (ADC).

The error signal may then be processed, for instance by an integration stage, before it is used, either on its own or in combination with other signals, to generate an amplifier output signal in order to drive a load. For an audio amplifier the load may be a loudspeaker. The amplifier may provide a single amplifier output signal in order to drive a load in a single sided arrangement. Alternatively, the amplifier may produce two output signals in order to drive the load in a two sided bridge arrangement. Such a two sided amplifier will typically incorporate feedback on both sides (commonly referred to as the high side and the low side).

Incorporating feedback can improve the performance of an amplifier by eliminating distortion and noise caused by, for instance, fluctuations in the power supply driving the load.

Amplifier circuits, including digital amplifiers, can be significantly at risk of physical damage being caused to circuit components through fault conditions at the output. Furthermore, fault conditions at the output can have a severe impact on the quality of the output signal if left undetected. Such fault conditions may include gross overload conditions for instance a short circuit between the output and ground where very large short circuit currents are obtained.

Alternatively, the fault conditions may include lower level overload conditions such as a short circuit between the high and low sides of a bridge driving the load (the load being short circuited) or a short circuit between the load and ground. For such low level overload conditions the severity of the fault condition may be related to the input level of the amplifier. A lower level short circuit may be more significant when the input to the amplifier is lower.

A further class of fault condition relates to the temperature of the transistor components in the output stages of the amplifier. As transistors heat up through prolonged use and/or high load currents they become less efficient, and also are at risk of overheating and therefore physical damage. It is an object of the present invention to obviate or mitigate one or more of the above disadvantages.

In particular, it is an aim of embodiments of the present invention to provide a fault detection circuit for a digital amplifier that is capable of providing an output signal indicative of the presence or absence of a fault condition at the output of the amplifier. According to the present invention there is provided an amplifier adapted to receive an input signal and to generate an output signal at an amplifier output according to the input signal, the amplifier comprising:

feedback means arranged to provide a feedback signal indicative of the output signal;

error signal generating means arranged to receive the feedback signal and generate a digital error signal according to the feedback signal; and output signal generating means arranged to generate the output signal and to receive the digital error signal and to adjust the output signal according to the digital error signal, the amplifier further comprising:

a fault detection circuit arranged to receive the digital error signal and to determine the presence or absence of a fault condition at the amplifier output according to the digital error signal and to provide a signal indicative of the presence or absence of the fault condition.

In certain embodiments the amplifier may further comprise fault response circuitry arranged to respond to the fault signal (the signal indicative of the presence or absence of the fault condition). In other words, the amplifier may include circuitry triggered by the fault signal(s).

Once a fault condition has been detected then preventative action may be taken to protect the amplifier circuit. This preventative action may include muting the output, applying a constant current limiter to reduce the current passing through the output stage of the amplifier or progressively reducing the output current, for example by attenuating the digital input signal. This preventative action may thus be carried out by fault response circuitry, which may also be described as protection circuitry. In preferred embodiments, the fault signal or signals may be indicative of a plurality of types of fault (e.g. of different severities) and the action taken in response to fault detection may be dependent upon the fault type.

Preferably, the fault detection circuit comprises a comparator arranged to compare the digital error signal with a predetermined threshold value and provide a comparator output signal.

In certain embodiments, the comparator output signal may be used directly as a signal indicative of the presence or absence of a fault condition, i.e. the fault detection circuit may be triggered to indicate a fault according to whether the digital error signal is greater or less than the predetermined threshold value. Additionally, or alternatively, the comparator output signal may be processed together with another signal, so that the fault signal is dependent on the comparator output and the other signal (which may, for example, be a signal dependent upon the magnitude of the input signal).

Alternatively, the fault detection circuit may comprise processing means (e.g. processing circuitry) arranged to process the digital error signal and a comparator arranged to compare the processed digital error signal with a predetermined threshold value and provide a comparator output signal. Again, the comparator output signal may be used directly as a fault signal (the fault detection circuit thus determining the presence or absence of a fault condition according to whether the processed digital error signal is greater or less than the predetermined threshold value), and/or processed with another signal to provide a fault indication.

The processing means may be arranged such that the processed digital error signal is indicative of an average value of the digital error signal and/or of a magnitude of an average value of the digital error signal. The processing means may comprise a filter arranged to filter the digital error signal, and the filter may comprise an averaging filter arranged such that the filtered digital error signal is the average of between 16 and 32 error signal samples.

The processing means may comprise a modulus arranged to receive the filtered digital error signal and to output a signal indicative of the magnitude of the filtered digital error signal, and the processed digital error signal may be the signal output by the modulus.

Thus, in certain embodiments, the determination of the presence or absence of a fault condition may be made solely from a comparison of the digital error signal (or a signal derived from it) with a single predetermined threshold value. Alternatively, or additionally, a fault condition (or another fault condition) may be determined by comparing the digital error signal (or a signal derived from it) with a plurality of thresholds, and the determination may also be dependent on the input signal.

In certain embodiments, the fault detection circuit comprises an input signal comparator arranged to compare an input signal with a predetermined input threshold, and an AND gate arranged to receive outputs from the input signal comparator and from the comparator receiving the digital error signal or processed digital error signal and to provide an AND gate output signal. The output from the AND gate may thus be used as a signal indicative of a fault condition (i.e. a fault signal).

Preferably, the fault detection circuit comprises processing means, arranged to process the digital error signal, and comparison means arranged to compare the processed digital error signal with a plurality of predetermined threshold values and provide a corresponding plurality of comparator output signals. The comparison means may then be further arranged to compare the input signal with a plurality of predetermined input signal threshold values and provide a corresponding plurality of comparator output signals. The amplifier may then comprise means for combining both sets of these comparator output signals to derive a single fault signal (which, therefore, is dependent upon the digital error signal and the input signal level).

In certain embodiments, the output signal is a first output signal generated at a first amplifier output, and the amplifier is further adapted to generate a second output signal at a second amplifier output according to the input signal, the amplifier further comprising:

second feedback means arranged to provide a second feedback signal indicative of the second output signal;

second error signal generating means arranged to receive the second feedback signal an generate a second digital error signal according to the second feedback signal; and second output signal generating means arranged to generate the second output signal and to receive the second digital error signal and to adjust the second output signal according to the second digital error signal, and wherein the fault detection circuit is arranged to receive the first and second digital error signals and to determine the presence or absence of a fault condition at the amplifier outputs according to the digital error signals and to provide a signal indicative of the presence or absence of the fault condition.

The fault detection circuit may then comprise: first processing means arranged to process the first digital error signal; a first comparator arranged to compare the first processed digital error signal with a first predetermined threshold value and provide a first comparator output signal; second processing means arranged to process the second digital error signal; and a second comparator arranged to compare the second processed digital error signal with a second predetermined threshold value to provide a second comparator output signal; and the fault detection circuit may be arranged to determine the presence of a fault condition according to the first and second comparator output signals. For example, it will output a fault signal if at least one of the processed digital error signals is greater than the corresponding predetermined threshold values.

The fault detection circuit may comprise an OR gate arranged to receive the first and second comparator output signals.

In certain embodiments the fault detection circuit further comprises:

third processing means arranged to process the first and second digital error signals and generate a third processed digital signal, said third processed digital signal being dependent on both the first and second digital error signals; and a third comparator arranged to compare the third processed signal with a third threshold value and provide a third comparator output signal, and the fault detection circuit is arranged to determine the presence or absence of a fault condition at the amplifier outputs according to the third comparator output signal.

The third processing means may comprise a filter arranged to filter the first digital error signal, a filter arranged to filter the second digital error signal, and a subtractor arranged to receive the filtered first and second digital error signals and generate a difference signal indicative of their difference. Additionally, the third processing means (or processing circuitry) may comprise a modulus arranged to receive the difference signal and output a magnitude signal indicative of the magnitude of the difference signal.

The fault detection circuit may further comprise:

an input signal comparator arranged to receive the input signal and compare the input signal with an input signal threshold value; and an AND gate arranged to receive the outputs of the third and input signal comparators and output an AND gate output signal, the fault detection circuit determining the presence or absence of a fault condition according to the AND gate output signal.

The fault detection circuit may comprise a plurality of comparators, each being arranged to compare the third processed digital signal with a respective threshold value and to output a respective comparison signal indicative of the result of the comparison. Then, the fault detection circuit may also include a corresponding plurality of input signal comparators, each arranged to compare the input signal with a respective predetermined input threshold value, and a corresponding plurality of AND gates, each AND gate being arranged to receive a respective comparison signal and an output signal from a respective input signal comparator and to provide a respective output signal. Additionally, the fault detection circuit may also comprise an OR gate arranged to receive the output signals from the plurality of AND gates.

In certain embodiments, the fault detection circuit further comprises:

processing means arranged to process the or each digital error signal and to provide a processed output signal;

a first register arranged to register the processed output signal at a frequency determined by a frequency clock;

an adder arranged to receive the output of the first register and a second register feedback signal;

a second register arranged to register the output of the adder at the frequency determined by the frequency clock;

feedback means arranged to provide the second register feedback signal to the adder from the output of the second register; and a comparator arranged to compare the output of the second register to a predetermined threshold value to provide a signal indicative of the presence or absence of a fault condition at an amplifier output.

In such embodiments, the processing means providing the processed output signal may be arranged to filter the or each digital error signal. The processing means providing the processed output signal may then comprise a first filter arranged to filter the first digital error signal, and the processed output signal is the filtered first digital error signal.

The processing means providing the processed output signal may comprise a first filter arranged to filter the first digital error signal, a second filter arranged to filter the second digital error signal, and a subtractor arranged to receive the filtered first and second digital error signals and generate a difference signal indicative of their difference. The processing means may then comprise a third filter arranged to filter the difference signal, the processed output signal being the output from the third filter.

In certain embodiments, the first filter may comprise an averaging filter arranged such that the filtered error signal is the average of between 16 and 32 error signal samples.

The difference signal may be a digital signal, and the second filter may comprise an averaging filter arranged such that the filtered difference signal is the average of between 16 and 32 error signal samples.

The amplifier may further comprise an output stage arranged to receive at least one of the comparator and/or AND gate output signals and provide a single fault signal indicative of the presence or absence of a fault condition at the amplifier output. That output stage may comprise an OR gate.

Another aspect of the invention provides a fault detection circuit for an amplifier in accordance with the first aspect of the invention.

According to another aspect of the invention, there is provided a method of detecting a fault condition at an output of an amplifier of the type generating an output signal according to an input signal and comprising feedback means arranged to provide a feedback signal indicative of the amplifier output signal, error signal generating means arranged to receive the feedback signal an generate a digital error signal according to the feedback signal, and output signal generating means arranged to generate the output signal and to receive the digital error signal and to adjust the output signal according to the digital error signal, the method comprising the steps of:
    monitoring the digital error signal (e.g. with a fault detection circuit); and
    determining the presence or absence of a fault condition at the amplifier output according to the digital error signal.

The step of determining may comprise the step of determining the presence or absence of a fault condition at the amplifier output according to the magnitude of the digital error signal, and the step of monitoring may comprise processing (which may comprise filtering) the digital error signal. The processing may additionally, or alternatively, comprise generating a signal corresponding to the magnitude of the digital error signal or the filtered digital error signal.

In certain embodiments, the step of determining comprises comparing the processed digital error signal with at least one predetermined threshold value, and using the results of the comparison as an indication of the presence or absence of a fault condition.

The method may also comprise the steps of:
    monitoring the input signal to the amplifier; and
    determining the presence or absence of a fault condition at the amplifier output according to the digital error signal and the input signal. The step of determining may then comprise the step of determining the presence or absence of a fault condition at the amplifier output according to the magnitude of the digital error signal and the magnitude of the input signal. This may comprise comparing the magnitude of the input signal with at least one predetermined threshold value.

Another aspect of the invention provides a method of detecting a fault condition at an output of an amplifier of the type generating first and second output signals at first and second outputs according to an input signal and comprising first and second feedback means arranged to provide first and second feedback signals indicative of the first and second amplifier output signals respectively, first and second error signal generating means arranged to receive the respective feedback signals an generate first and second digital error signals according to the first and second feedback signals respectively, and first and second output signal generating means arranged to generate the first and second output signals and to receive the first and second digital error signals and to adjust the output signals according to the digital error signals, the method comprising the steps of:
    monitoring the first digital error signal;
    determining the presence or absence of a fault condition at an amplifier output according to the first digital error signal;
    monitoring the second digital error signal; and
    determining the presence or absence of a fault condition at an amplifier output according to the second digital error signal.

This method may further comprise the steps of:
    monitoring the input signal to the amplifier;
    processing the first and second digital error signals to provide a processed signal dependent upon both the first and second digital error signals; and
    determining the presence or absence of a fault condition at an amplifier output according to the processed signal and the input signal. The processed signal may be indicative of a difference between the first and second digital error signals.

An advantage of certain embodiments of the present invention is that by measuring the magnitude of the error signal (or signals), faults at the output of the amplifier may be detected, generating a signal that may be used to activate fault prevention circuitry (which may also be described as protection circuitry).

Figure 2:
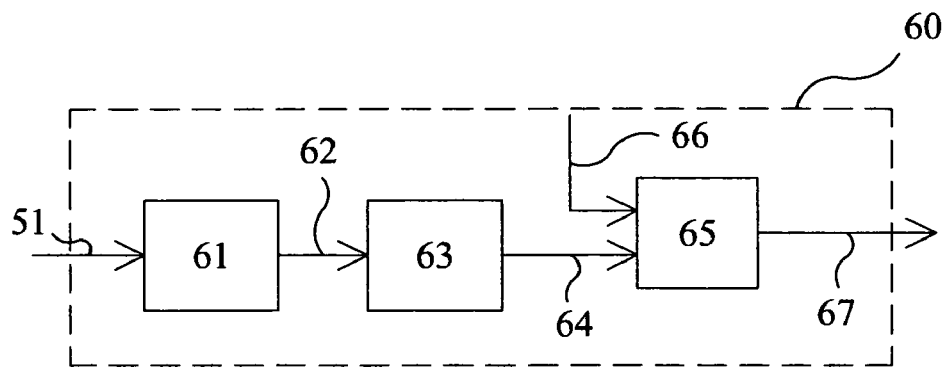
Figure 3:
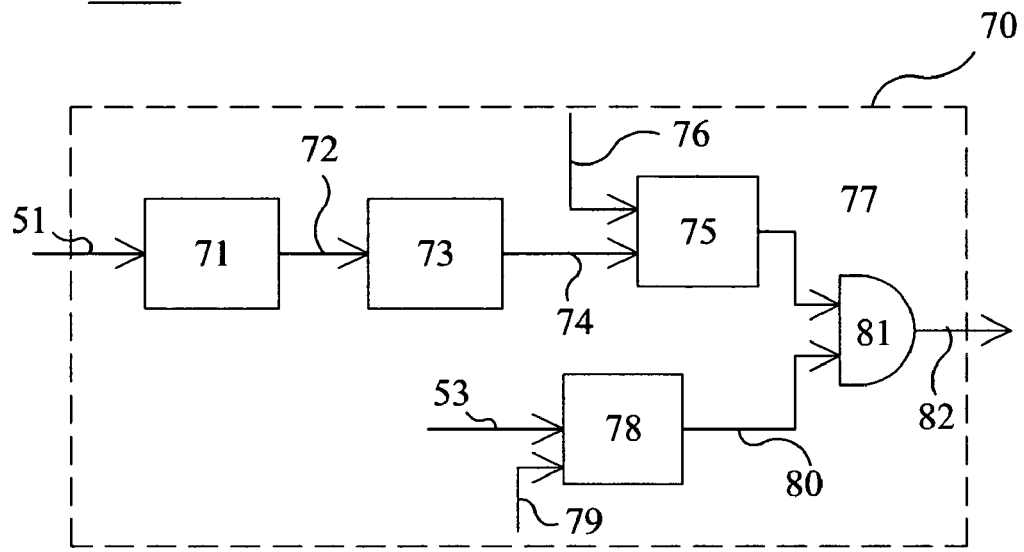
Figure 4:
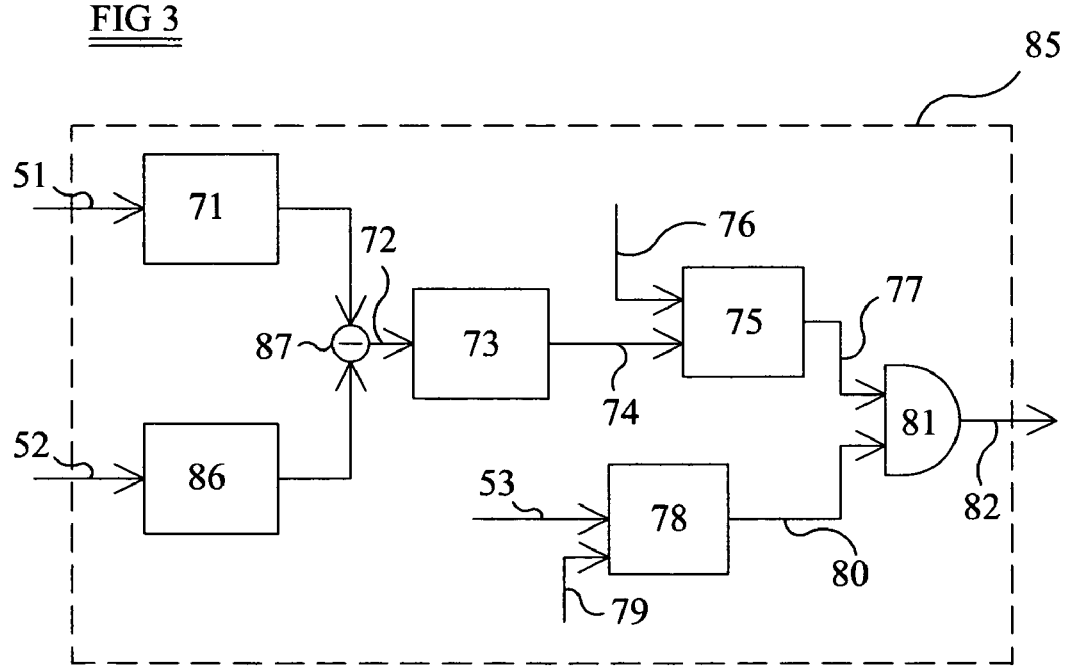
Figure 7:
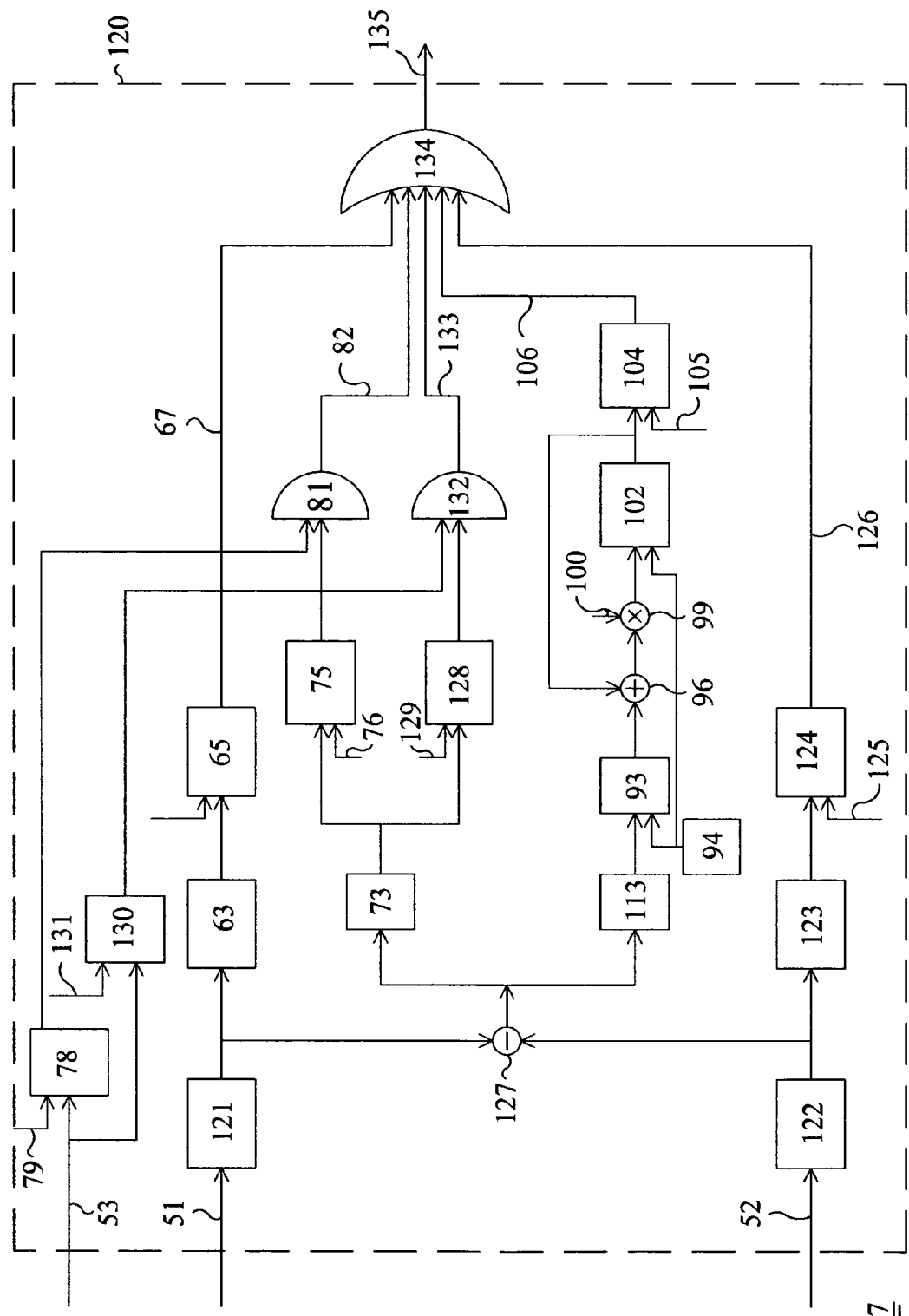

The present invention will now be described, by way of example only, with reference to the accompanying drawings in which:

FIG. 1 schematically represents a digital amplifier, incorporating a fault detection circuit, in accordance with an embodiment of the present invention;

FIG. 2 schematically represents a gross overload fault detection circuit in accordance with an embodiment of the present invention;

FIG. 3 schematically represents a low level overload fault detection circuit in accordance with an embodiment of the present invention;

FIG. 4 schematically represents a low level overload fault detection circuit in accordance with a further embodiment of the present invention;

FIG. 5 schematically represents a thermal fault detection circuit in accordance with an embodiment of the present invention;

FIG. 6 schematically represents a thermal fault detection circuit in accordance with a further embodiment of the present invention; and FIG. 7 schematically represents a fault detection circuit in accordance with an embodiment of the present invention.

One form of digital amplifier for which a fault detection circuit in accordance with the present invention is particularly suitable is described in British patent application number 0424122.0. It operates by generating a reference signal, corresponding to the desired output signal, from the digital input signal, and comparing this reference signal with the actual output signal to generate an error signal. The error signal passes through an analog to digital converter in order to provide a digital error signal. This error signal is then further processed and combined with the original digital input signal and passed to a conventional pulse width modulation stage to drive the output stage. If the output is too low then the error becomes positive thereby increasing the output. If the output is too high, the error signal goes negative, hence decreasing the output. In the described embodiment, each side of the bridge is individually compared, i.e. two error signals are used, one derived from the high side of the output, and one from the low side.

In the described digital amplifier the feedback is global in the sense that it encompasses the whole of the amplifier from the input stage to the output stage. This is in contrast to conventional delta-sigma amplifiers for which feedback only encompasses the modulator. Additionally, the amplifier may operate as a single sided amplifier, or alternatively the output may be driven by a H-bridge with the H-bridge driven by two complementary signal processing stages. For each of the complementary signal processing stages an error signal is individually generated.

Referring now to FIG. 1, a digital input signal is supplied to the amplifier 1 by input stage 2. The digital input signal is supplied to a primary digital noise shaper 3, which may be of any form conventional in the art. The primary digital noise shaper 3 generates a 7 bit noise shaped output, which is updated at a first switching frequency. In certain preferred embodiments this first frequency is 843.75 kHz, and this may conveniently be derived from a master clock frequency of 108 MHz. Clocks operating at this frequency are commercially available. It will be appreciated, however, that the first frequency, in alternative embodiments, may have different values. For example, the first frequency may be in the range 400 kHz to 8 MHz The output of the primary digital noise shaper 3 comprises noise shaped data, and is fed to each complementary signal processing stage 4 and 5. The signal passed to signal processing stage 5 is first passed through an inverter 6. This allows the output of signal processing stage 4 to drive the high side of a H-bridge driving the output 7 (which in certain embodiments is a loudspeaker as shown) and the output of signal processing stage 5 to drive the low side of the H-bridge. The H-bridge comprises conventional output stages 21 and 41 forming part of complementary signal processing stages 4 and 5 respectively.

The signal supplied to signal processing stage 4 on line 8 is fed to a first modulation stage 9. First modulation stage 9 comprises a pulse width modulator, which converts the noise shaped digital input signal to a PWM signal. The pulse width modulator 9 operates at a lower switching frequency than the primary digital noise shaper 3. It typically operates at half the switching frequency of the primary digital noise shaper 3, i.e. between 200 kHz and 4 MHz. Thus, the output of the primary noise shaper may be updated at twice the PWM switching frequency. The detail of the pulse width modulator 9 may be entirely conventional, and as such will not be further described here.

The PWM signal is inverted by inverter 10 and fed via resistor 11 to difference stage 12. The signal passed to difference stage 12 thus comprises a first modulated digital reference signal. The first digital reference signal is indicative of the desired digital output signal, i.e. it represents what the true digital output signal should be. By comparison with the true output any error may be counteracted, such that inaccuracies in the power supply or the output stages may be removed. In order to achieve this, difference stage 12 further receives a first feedback signal and compares this to the first reference signal to generate a first error signal, which is output on line 13. The first error signal is passed to an integration stage 44. Integration stage 44 comprises an analogue integrator 14 and a digital integration stage 18. Analogue integrator 14 comprises an op-amp 15 and capacitor 16. The output of analogue integrator 14 is fed to an analogue to digital converter (ADC) 17, which generates a high resolution digital signal. The resolution of the digital signal may be 14 bits in certain embodiments, or even greater.

The digitised signal is passed to at least two further integrators, making a total of at least three integrations performed on the error signal. At least three integrators are required to obtain the desired signal to noise, distortion and power supply rejection ratio for a high quality digital amplifier operating at a relatively low switching speed. The three integrations may be provided by any combination of digital and/or analogue integrators, and each integrator may be of any form that is known in the art. In the illustrated embodiment the digitised signal (from ADC 17) is passed to three further integrators, all of which are digital, schematically illustrated as being grouped together in digital integration stage 18. It is advantageous for these three integrators 18 to all be digital to reduce the number of required input and output pins if the amplifier is fabricated as an integrated circuit using a standard digital CMOS process.

The output of digital integration stage 18 can be regarded as a first noise shaped error signal 51. This is added to the original noise shaped data from primary digital noise shaper 3 in summer stage 19. In this example, summer stage 19 also truncates the signal to 8 bits. The signal is then passed to a second modulation stage 20, comprising a pulse width modulator. The pulse width modulator 20 utilises rising and falling edges of the master clock to encode an extra least significant bit of data. The signal is then passed to a conventional output stage 21, which delivers current to the output load 7.

The signal from the output stage 21 forms the first feedback signal, which is supplied to difference stage 12. The gain of the feedback signal is determined by resistors 22 and 23, which form a potential divider between the output stage 21 and a ground connection, together with resistor 11.

Signal processing stage 5 provides a duplicate of signal processing stage 4, except that it operates on an inverted noise shaped signal from the primary digital noise shaper. The signal passes through modulation stage 29, inverter 30, and resistor 31 to difference stage 32 where it comprises a second digital reference signal. This is compared to a second feedback signal, to provide a second error signal output on line 33. This second error signal is then processed by integration stage 45. Integration stage 45 comprises analogue integrator 34, which comprises op-amp 35 and capacitor 36, ADC 37 and digital integration stage 38. The signal is then added to the inverse of the original digital input signal in summer 39. The resultant signal is then truncated to 8 bits and modulated by modulation stage 40, which comprises a pulse width modulator in order to drive output stage 41.

A pulse width modulator 40 operating at a switching frequency of between 200 kHz and 4 MHz has been shown to provide satisfactory signal to noise performance. Gain for the second feedback signal is provided by resistors 31, 42 and 43.

Alternatively, the amplifier may operate as a single sided system, with the other side of the load connected to ground. However, it is advantageous to operate with two sides as this halves the voltage applied across the transistor switches within the output stages 21, 31.

A fault detection circuit 50 in accordance with the present invention has a first input 51 arranged to provide the integrated digital error signal output from digital integration stage 18 from signal processing stage 4. Fault detection circuit 50 has a second input 52 arranged to provide the integrated digital error signal output from digital integration stage 38 from signal processing stage 5. Fault detection circuit 50 has a third input 53 arranged to provide the input signal from input stage 2. For a single sided system the fault detection circuit only has a single input arranged to provide an integrated error signal.

Fault detection circuit 50 has an output 54 arranged to provide an output signal indicative of the presence or absence of a fault condition at the output 7 of amplifier 1. Output 54 provides the signal indicative of the presence or absence of a fault condition at the output 7 by analysing the digital error signals output from digital integration stages 18 and 38 and the input signal from input stage 2. These error signals are used within amplifier 1 to adjust the output PWM signal to output 7.

Referring now to FIG. 2, this schematically represents a gross overload fault detection circuit 60 in accordance with a first embodiment of the present invention. The gross overload fault detection circuit comprises an averaging filter 61 arranged to receive the digital error signal from input 51. It will be readily appreciated that the gross overload fault detection circuit 60 may be arranged such that the averaging filter 61 receives the digital error signal from input 52. Alternatively, there may be two gross overload fault detection circuits 60 arranged to receive the digital error signals from inputs 51 and 52.

Averaging filter 61 provides a simple average of the preceding error data. The number of samples is important. If too small a number of samples is used then a fault condition may be detected incorrectly when the amplifier is first switched on as the amplifier is momentarily unstable. However, if too large a number of samples is used then the speed of detecting faults is reduced. A suitable number of samples is between 16 and 32, which provides an acceptably low detection time of typically 10-20 µs for an amplifier running at 800 kHz.

The output of averaging filter 61 on line 62 is provided to modulus 63 which determines the magnitude of the filtered error signal and outputs the magnitude on line 64. The magnitude signal is input to comparator 65, which compares the signal to a predetermined threshold input to the comparator 65 on line 66. When the filtered error signal is greater than the predetermined threshold, comparator 65 outputs a signal on output 67 indicative of the presence of a gross overload fault condition at the output 7 of the amplifier 1. A gross overload, such as a short circuit between the output 7 and ground will cause the amplifier output signal to change significantly. Therefore, the difference between the output and the input signals to the amplifier (i.e. the digital error signal) will increase significantly. By choosing an appropriate predetermined threshold value the fault detection circuit will indicate the presence of a gross overload fault condition at output 7, while not triggering during normal operation of the amplifier.

FIG. 3 schematically represents a low level overload fault detection circuit 70 in accordance with an embodiment of the present invention. The gross overload fault detection circuit comprises an averaging filter 71 arranged to receive the digital error signal from input 51. It will be readily appreciated that the low level overload fault detection circuit 70 may be arranged such that the averaging filter 71 receives the digital error signal from input 52. The averaging filter 71 for the low level overload fault detection circuit 70 may be of the same sort as the averaging filter 61 for the gross overload fault detection circuit 60. Alternatively, the averaging filter may be common to both circuits.

The output of averaging filter 71 on line 72 is provided to modulus 73 which determines the magnitude of the filtered error signal and outputs the magnitude on line 74. Modulus 73 may be of the same sort as modulus 63. Alternatively, the modulus may be common to both circuits.

The magnitude signal is input to comparator 75, which compares the signal to a predetermined threshold on line 76. When the filtered error signal is greater than the predetermined threshold, comparator 75 outputs a signal on output line 77. Low level overload fault detection circuit 70 further comprises a second comparator 78 arranged to receive the input signal to the digital amplifier on line 53. Comparator 75 compares the input signal to a predetermined threshold input to the comparator 75 on line 79. When the input signal is less than the predetermined threshold, comparator 75 outputs a signal on output line 80. This determines an input signal range.

A logical AND gate 81 is arranged to receive the signal from each comparator 75, 78 on lines 77, 80 and provide an output signal on output line 82 if the signal on both lines corresponds to a logical high signal. The result is that when the input signal is less than the predetermined threshold for comparator 78 and the filtered error signal is greater than the predetermined threshold for comparator 75 the signal on output line 82 is indicative of the presence of a low level overload fault condition at the output 7 of the amplifier. The addition of a comparator to check that the input signal is less than a predetermined threshold allows the low level overload fault detection circuit to be triggered by lower average error signals than those necessary to trigger the gross overload fault detection circuit when the input signal is below the predetermined threshold. This is desirable because a low level overload may be more detrimental to the operation of the amplifier when the amplifier is operating on a low level input than if the amplifier is operating on a higher level input. Additionally, the error signal will be lower for low level inputs, meaning that expected fluctuations in the error signal will be lower.

The fault detection circuit of FIG. 3 may be modified such that the input signal is compared to a plurality of predetermined threshold values to determine a plurality of input ranges. The error signal may similarly be compared to a plurality of predetermined threshold values such that the level of average error necessary to trigger a fault may be more closely matched to the level of the input signal. This provides improved accuracy of fault detection. However, it incurs increased implementation costs and set up difficulty.

FIG. 4 schematically represents a modification of the low level overload fault detection circuit of FIG. 3. Circuit components common to both circuits are given the same reference numeral. For low level overload fault detection circuit 85 both digital error signals provided on lines 51 and 52 are filtered by averaging filters 71 and 86. The filtered error signals are then passed to a subtractor 87 arranged to provide the difference between the filtered error signals to the modulus 73 on line 72.

It is advantageous for the low level overload fault detection circuit to operate on the difference signal between the two averaged error signals in this manner in order to remove any power supply DC offset voltage present when the amplifier is operating in a two sided configuration. This prevents a DC offset voltage from inadvertently triggering the low level overload fault detection circuit.

FIG. 5 schematically represents a thermal fault detection circuit 90 in accordance with an embodiment of the present invention. The thermal fault detection circuit 90 comprises an averaging filter 91 arranged to receive the digital error signal from input 51. It will be readily appreciated that the thermal fault detection circuit 90 may be arranged such that the averaging filter 91 receives the digital error signal from input 52. The averaging filter 91 for the low level overload fault detection circuit 70 may be of the same sort as the averaging filter 61 for the gross overload fault detection circuit 60 or the averaging filter 71 for the low level overload fault detection circuit 70. Alternatively, the averaging filter may be common to all three circuits.

The filtered error signal output from the averaging filter on line 92 is registered by first register 93, at a suitably low clock rate driven by frequency clock 94. The clocking rate set by frequency clock 94 is lower than the sampling rate of the digital error signal input on lines 51 or 52. The frequency of frequency clock is typically of the order of 1 Hz. The output of register 93 is connected via line 95 to adder 96. Adder 96 also receives a feedback signal on line 97. The output of adder 96 on line 98 is passed to multiplier 99, which multiplies the signal by a predetermined variable on line 100. The predetermined variable in this embodiment is a predetermined fractional coefficient variable which corresponds to the thermal resistance of the output stages 21, 41. The output of multiplier 99 on line 101 is registered by second register 102 which is also driven at the clock rate provided by frequency clock 94.

The output of second register 102 provides the feedback signal to adder 96 on line 97. The output of the second register 102 is also passed via line 103 to comparator 104 which compares the signal to a predetermined threshold provided by line 105. The predetermined threshold corresponds to the temperature trip value of the thermal fault detection circuit 90. If the signal on line 103 exceeds the predetermined threshold on line 105 the comparator provides an output on line 106 indicative of the presence of a thermal fault condition at the output 7 of the amplifier 1.

The thermal fault detection circuit operates by ramping up the output from the second register 102 each clock cycle by an amount equal to the multiple of the current filtered error and a predetermined value. Effectively, The output on line 106 will indicate a thermal fault condition after a period of time proportional to the average error value during that time and the predetermined value. This is representative of the increase in temperature in the output stages 21, 41 because for a large error the current flowing through the output 7 is increased causing an increase in the heating of the output 7. The error signal is integrated to reflect the increased heating of the output with prolonged current flow.

FIG. 6 schematically represents a modification of the thermal fault detection circuit of FIG. 5. Circuit components common to both circuits are given the same reference numeral. For thermal fault detection circuit 110 both digital error signals provided on lines 51 and 52 are filtered by averaging filters 91 and 111. The filtered error signals are then passed to a subtractor 112 arranged to provide the difference between the filtered error signals to the averaging filter 113 on line 114. Averaging filters 91 and 111 may be the same as filters 71 and 86 for the low level overload fault detection circuit of FIG. 3. Alternatively, the same pair of filters (together with subtractor 87/112) may be common to both. Averaging filter 113 is required to filter the difference signal in order to prevent random changes between the two digital error signals combining together to trigger a large change in the difference signal. The remainder of thermal fault detection circuit 110 is identical to thermal fault detection circuit 90.

It is advantageous for the thermal fault detection circuit to operate on the difference signal between the two averaged error signals in this manner in order to remove any power supply DC offset voltage present when the amplifier is operating in a two sided configuration. This prevents such a harmless DC offset voltage from inadvertently triggering the thermal fault detection circuit.

Referring now to FIG. 7, this schematically represents a preferred embodiment of the present invention in which the fault detection circuit 120 comprises in combination gross overload, low level overload and thermal fault detection circuits as described above with reference to FIGS. 2, 4 and 6. As such, identical components are referred to by the same reference numerals.

The fault detection circuit 120 has inputs 51 and 52 arranged to provide the digital error signals from each side of the amplifier 1. Each digital error signal is arranged to pass through an averaging filter 121, 122 and each filtered error signal is passed through a gross overload fault detection circuit comprising modulus' 63, 123 and comparators 65, 124 arranged to compared the magnitude of the filtered error signals to predetermined thresholds provided on lines 66, 125. If the magnitude of a filtered digital error signal exceeds the respective threshold then a signal indicative the presence or absence of a gross overload fault condition is output either line 67 or 126.

The filtered error signals output from averaging filters 121, 122 are passed to a subtractor 127. The subtractor is arranged to provide the difference between the two filtered error signals to the low level overload and fault detection circuits as described in relation to FIGS. 4 and 6. The thermal fault detection circuit is unchanged, and continues to provide an output signal on line 106 indicative of the presence or absence of a thermal fault condition at the output 7 of the amplifier as before.

The low level overload circuit is shown comprising a pair of first comparators 75, 128 arranged to compare the magnitude of the difference signal output from modulus 73 to two predetermined thresholds provided on lines 76 and 129. Similarly, the input signal to the amplifier 1 on line 53 is passed to two comparators 78, 130 and compared to two predetermined thresholds on lines 79, 131 to determine two input signal ranges. The outputs from comparators 75, 78 and 128, 130 are processed by logical AND gates 81, 132 respectively. AND gates 81, 132 provide output signals on lines 82, 133 indicative of the presence or absence of low level overload faults at the output 7 of the amplifier 1.

The fault detection circuit 120 further comprises an output stage 134 arranged to receive the output signals on lines 67, 82, 106, 126, 133 and provide a single output on line 135 if any of the signals on lines 67, 82, 106, 126, 133 indicate a fault at the output 7 of amplifier 1. Output stage 134 comprises a logical OR gate.

It will be readily apparent that the fault detection circuit may comprise any combination of gross overload, low level overload and thermal fault detection circuit. Furthermore, the fault detection circuit may be arranged to operate with a single sided or a two sided amplifier, and the gross overload circuit may be arranged to detect gross overloads on either or both sides. Similarly the low level overload circuit and the thermal circuit may be arranged to detect low level overloads on either or both sides, or on the difference signal between the two digital error signals. The low level overload circuit may comprise any number of comparators arranged to establish input signal ranges.

The averaging filters may comprise the simple average filters described above or they may comprise any filter known in the art.

The fault detection circuit may be applied to any digital amplifier comprising amplifier feedback means arranged to provide a digital error signal. The digital error signal is that used within the amplifier in order to generate an output signal for driving a load at an amplifier output. Due to the feedback means the digital error signal is indicative of changes in the output signal, thereby allowing monitoring of the digital error signal or signals to indicate the presence or absence of fault conditions at the output of the amplifier.

From the above description, it will be apparent that an amplifier incorporating fault detection means and embodying the invention may be a digital amplifier of the type comprising:
  a first modulation stage arranged to receive a digital data signal and to generate a corresponding modulated reference signal;
  a comparator arranged to receive a feedback signal and the modulated reference signal and generate a corresponding error signal indicative of a difference between the modulated reference signal and the feedback signal;
  an integration stage arranged to integrate the error signal from the comparator to generate an integrated digital error signal;
  a summer arranged to receive the integrated digital error signal and the digital data signal and generate an adjusted (in effect, a corrected) digital data signal indicative of their sum;
  an output stage comprising a second modulation stage, the output stage being arranged to receive the adjusted digital data signal and to generate a corresponding modulated output signal for driving a load; and
  feedback means arranged to provide said feedback signal to the comparator, the feedback signal being indicative of the modulated output signal.

In such an example, the digital error provided to the fault detection circuit is the integrated digital error signal.

Preferably, the integration stage comprises at least three integrators arranged to provide at least third order integration of the error signal. These at least three integrators may all be digital, or alternatively may be a combination of analogue and digital integrators.

In certain preferred embodiments the second modulation stage operates at a switching frequency within the range 0 Hz-4 MHz, and in others within the range 200 kHz-4 MHz.

Amplifiers embodying the invention may further comprise a digital noise shaper adapted to receive a digital input signal and to noise-shape the digital input signal and provide the noise-shaped signal to the first modulation stage as the digital data signal.

In certain preferred embodiments, the first modulation stage comprises a pulse width modulator and the modulated reference signal is a pulse width modulated signal. The second modulation stage may also comprise a pulse width modulator and the modulated output signal may be a pulse width modulated signal.

The first modulation stage may comprise a modulator, arranged to receive the digital data signal, and an inverter arranged to invert the modulator output.

In certain preferred embodiments the second modulation stage is arranged to generate a modulated control signal corresponding to the adjusted digital data signal, and the output stage further comprises switching means arranged so as to be controlled by the modulated control signal.

The modulated output signal may be a modulated output voltage for application to one side of a load.

Advantageously, the integration stage comprises a first analogue integrator arranged to integrate the error signal, an analogue to digital converter (ADC) arranged to convert an analogue output of the first analogue integrator to a digital signal, and two digital integrators arranged in series to integrate the digital signal from the ADC.

Thus, the integration stage may comprise a combination of analogue and digital integrators, i.e. it may include at least one analogue integrator, an analogue to digital converter, and at least one digital integrator. Alternatively, the integration stage may comprise only digital integrators, and preferably at least three.

In embodiments comprising an ADC to convert the output of an analogue integrator/integration stage, the ADC preferably provides at least 10 bit resolution, and ideally of the order of 14 bit resolution.

In certain preferred embodiments the modulated output signal is a modulated voltage, and the feedback means comprises a voltage divider, arranged such that the feedback signal is a voltage signal proportional to the output voltage.

In further preferred embodiments, he modulated output signal is a modulated output voltage for application to one side of a load, and the amplifier further comprises:
  an inverter arranged to invert the digital data signal
  a third modulation stage arranged to receive the inverted digital data signal and to generate a corresponding second modulated reference signal;
  a second comparator arranged to receive a second feedback signal and the second modulated reference signal and generate a corresponding second error signal indicative of a difference between the second modulated reference signal and the second feedback signal;
  a second integration stage arranged to integrate the second error signal from the second comparator to generate a second integrated digital error signal;
  a second summer arranged to receive the second integrated digital error signal and the inverted digital data signal and generate a second adjusted (corrected) digital data signal indicative of their sum;
  a second output stage comprising a fourth modulation stage, the second output stage being arranged to receive the second adjusted digital data signal and to generate a corresponding second modulated output signal for driving a load; and
  second feedback means arranged to provide said second feedback signal to the second comparator, wherein the second modulated output signal is a second modulated voltage for application to a second side of the load, and the second feedback signal is indicative of the second modulated voltage.

The first and second output stages may comprise an H-bridge circuit for driving an output load.

The first and second digital error signals provided to the fault detection circuit may thus be the first and second integrated digital error signals. The fault detection circuit may then be arranged to detect a first fault condition according to the magnitudes of the first and second integrated digital error signals, and a second fault condition according to a difference between the error signals, in combination with a magnitude of the input signal. A third fault condition may be detected according to a difference between the error signals, irrespective of the magnitude of the input signal.

It will be appreciated from the description of FIGS. 1 and 7 in particular, that in certain embodiments the protection circuitry (fault detector) works by analysing the amplifier error signals that are used to increase or decrease the output PWM signals. Certain embodiments have 3 modes of operation:

a. Gross overload. This is a simple comparator set to pre-set thresholds monitoring each averaged error signal. This handles large errors, such as OP short to GND, where very large short circuit currents are obtained.

b. Low level overload. This checks for smaller overloads, such as OP to OP shorts and loudspeaker to GND shorts. This works by using the fact that the OP depends on the input levels; for very low level inputs, then the OP error signal is smaller than for high level inputs. Thus different thresholds are programmed for different input levels. To remove harmless power supply offsets, the thresholds are compared against the difference between the A and B-side error signals.

c. Thermal. The error signal gives information on the current being drawn on the OP, and hence gives information that can be used to infer the OP FET temperature.

FIG. 7 shows a protection circuit covering all 3 modes of detection. The error data from both sides of the amplifier are first passed through averaging filters 121,122, giving a simple average of the preceding error data. More sophisticated filtering schemes are possible. The number of samples is important; if too small a number of samples, then the protection can be triggered at start-up, as the system is momentarily unstable. Too long a number of samples reduce the speed of triggering for the protection. A suitable compromise is 16 to 32 output transitions, which would give acceptably low detect time of typically 10 to 20 uS for 800 kHz switching frequency. For gross overload, the outputs of the filters 121 and 122 are fed to modulus 63 and 123, where the magnitudes of the signals are obtained. Comparators 65 and 124 compare the signals to a threshold, i.e. a pre-set variable. When the averaged error signal from each side is too large, the protection is triggered through OR gate 134.

For low level overload, subtractor 127 obtains the difference of the averaged error signals. Again the modulus is obtained (using 73), and the signal is compared to pre-set thresholds via 75 and 128. If the thresholds are passed, and the input data is within range, then protection is detected. This is achieved by AND gates 81 and 132.

Thermal protection is also provided by modulus 113 and subsequent components on FIG. 7.

Fault detection circuits embodying the invention may also be described as protection circuits. In certain embodiments, the protection circuit will detect all forms of overload and shorts. In the case of an amplifier incorporating single ended power supply H bridge output stages, where the power supply is grounded, one gets a common mode output voltage of half the bridge voltage. A protection circuit embodying the invention may be arranged to detect for imbalances in the bridge, caused for example by the driven load (e.g. a loudspeaker) being connected to one output and ground. Thus, in this instance, protection for the loudspeaker is also achieved.

Advantageously, embodiments of the invention may provide a self test mode (i.e. in the case of amplifiers, they may incorporate self test circuitry and/or be operable in a self test mode, and methods embodying the invention may include a self test step or steps). For example, fault detectors/protection circuits embodying the invention may incorporate memory means (such as registers) to monitor cumulative errors, and provide information such as how many times faults were detected over a particular time interval (e.g. protection was triggered once in the last 8 hours of operation). This facility to record fault detection (or, equivalently, protection triggers) is useful for soak testing.

Embodiments of the invention may also provide useful diagnostic information. Embodiments may provide fault signals that are indicative of the type of fault/error that has occurred, and its direction. From the type of error, and its direction, one can infer if the output stage is working correctly, and where a particular fault occurs.

Embodiments may also provide a load sensing facility. The error(fault) signal, for a defined output stage and defined signal level, gives information on the load that is attached, and from this the impedance of the load can be inferred. This is useful in two circumstances—in setting up an amplifier, to confirm that the load is connected; and in automatically adapting the frequency response to compensate for the load impedance changing the frequency response. This last point is due to the output filters, that are typically employed, having a different frequency response depending on load impedance.

Further applications and modifications of the present invention will be readily apparent to the appropriately skilled person.

The invention claimed is:

1. An amplifier adapted to receive an input signal and to generate an output signal at an amplifier output according to the input signal, the amplifier comprising:

a feedback circuit arranged to provide a feedback signal indicative of the output signal;

an error signal generating circuit arranged to receive the feedback signal and generate a digital error signal according to the feedback signal; and an output signal generating circuit arranged to generate the output signal and to receive the digital error signal and to adjust the output signal according to the digital error signal, the amplifier further comprising:

a fault detection circuit arranged to receive the digital error signal and to determine the presence or absence of a fault condition at the amplifier output according to the digital error signal and to provide a signal indicative of the presence or absence of the fault condition.

2. An amplifier in accordance with claim 1, wherein the fault detection circuit comprises a comparator arranged to compare the digital error signal with a predetermined threshold value and provide a comparator output signal.

3. An amplifier in accordance with claim 2, wherein the fault detection circuit comprises an input signal comparator arranged to compare an input signal with a predetermined input threshold, and an AND gate arranged to receive outputs from the input signal comparator and from the comparator receiving the digital error signal or processed digital error signal and to provide an AND gate output signal.

4. An amplifier in accordance with claim 1, wherein the fault detection circuit comprises a processing circuit arranged to process the digital error signal and a comparator arranged to compare the processed digital error signal with a predetermined threshold value and provide a comparator output signal.

5. An amplifier in accordance with claim 4, wherein the processing circuit is arranged such that the processed digital error signal is indicative of an average value of the digital error signal.

6. An amplifier in accordance with claim 4, wherein the processing circuit is arranged such that the processed digital error signal is indicative of a magnitude of an average value of the digital error signal.

7. An amplifier in accordance with claim 4, wherein the processing circuit comprises a filter arranged to filter the digital error signal.

8. An amplifier in accordance with claim 7, wherein the filter comprises an averaging filter arranged such that the filtered digital error signal is the average of between 16 and 32 error signal samples.

9. An amplifier in accordance with claim 7, wherein the processing circuit comprises a modulus arranged to receive the filtered digital error signal and to output a signal indicative of the magnitude of the filtered digital error signal.

10. An amplifier in accordance with claim 9, wherein the processed digital error signal is the signal output by the modulus.

11. An amplifier in accordance with claim 1, wherein the fault detection circuit comprises a processing circuit arranged to process the digital error signal and a comparator arranged to compare the processed digital error signal with a plurality of predetermined threshold values and provide a corresponding plurality of comparator output signals.

12. An amplifier in accordance with claim 11, wherein the comparator is further arranged to compare the input signal with a plurality of predetermined input signal threshold values and provide a corresponding plurality of comparator output signals.

13. An amplifier in accordance with claim 12, wherein the fault detection circuit comprises:
a processing circuit arranged to process the first digital error signal;
a first comparator arranged to compare the first processed digital error signal with a first predetermined threshold value and provide a first comparator output signal;
a second processing circuit arranged to process the second digital error signal; and
a second comparator arranged to compare the second processed digital error signal with a second predetermined threshold value to provide a second comparator output signal; and
the fault detection circuit is arranged to determine the presence of a fault condition according to the first and second comparator output signals.

14. An amplifier in accordance with claim 13, wherein the fault detection circuit comprises an OR gate arranged to receive the first and second comparator output signals.

15. An amplifier in accordance with claim 1, wherein the output signal is a first output signal generated at a first amplifier output, and the amplifier is further adapted to generate a second output signal at a second amplifier output according to the input signal, the amplifier further comprising:
a second feedback circuit arranged to provide a second feedback signal indicative of the second output signal;
a second error signal generating circuit arranged to receive the second feedback signal an generate a second digital error signal according to the second feedback signal; and
a second output signal generating circuit arranged to generate the second output signal and to receive the second digital error signal and to adjust the second output signal according to the second digital error signal,
and wherein the fault detection circuit is arranged to receive the first and second digital error signals and to determine the presence or absence of a fault condition at the amplifier outputs according to the digital error signals and to provide a signal indicative of the presence or absence of the fault condition.

16. An amplifier in accordance with claim 15, wherein the fault detection circuit further comprises:
a third processing circuit arranged to process the first and second digital error signals and generate a third processed digital signal, said third processed digital signal being dependent on both the first and second digital error signals; and
a third comparator arranged to compare the third processed signal with a third threshold value and provide a third comparator output signal,
and the fault detection circuit is arranged to determine the presence or absence of a fault condition at the amplifier outputs according to the third comparator output signal.

17. An amplifier in accordance with claim 16, wherein the third processing circuit comprises a filter arranged to filter the first digital error signal, a filter arranged to filter the second digital error signal, and a subtractor arranged to receive the filtered first and second digital error signals and generate a difference signal indicative of their difference.

18. An amplifier in accordance with claim 17, wherein the third processing circuit comprises a modulus arranged to receive the difference signal and output a magnitude signal indicative of the magnitude of the difference signal.

19. An amplifier in accordance with claim 16, wherein the fault detection circuit further comprises:
an input signal comparator arranged to receive the input signal and compare the input signal with an input signal threshold value; and
an AND gate arranged to receive the outputs of the third and input signal comparators and output an AND gate output signal, the fault detection circuit determining the presence or absence of a fault condition according to the AND gate output signal.

20. An amplifier in accordance with claim 16, wherein the fault detection circuit comprises a plurality of comparators, each being arranged to compare the third processed digital signal with a respective threshold value and to output a respective comparison signal indicative of the result of the comparison.

21. An amplifier in accordance with claim 20, wherein the fault detection circuit comprises a corresponding plurality of input signal comparators, each arranged to compare the input signal with a respective predetermined input threshold value, and a corresponding plurality of AND gates, each AND gate being arranged to receive a respective comparison signal and an output signal from a respective input signal comparator and to provide a respective output signal.

22. An amplifier in accordance with claim 21, wherein the fault detection circuit comprises an OR gate arranged to receive the output signals from the plurality of AND gates.

23. An amplifier in accordance claim 1, wherein the fault detection circuit further comprises:
a processing circuit arranged to process the or each digital error signal and to provide a processed output signal;
a first register arranged to register the processed output signal at a frequency determined by a frequency clock;
an adder arranged to receive the output of the first register and a second register feedback signal;
a second register arranged to register the output of the adder at the frequency determined by the frequency clock;
a feedback circuit arranged to provide the second register feedback signal to the adder from the output of the second register; and
a comparator arranged to compare the output of the second register to a predetermined threshold value to provide a signal indicative of the presence or absence of a fault condition at an amplifier output.

24. An amplifier in accordance with claim 23, wherein the processing circuit providing the processed output signal is arranged to filter the or each digital error signal.

25. An amplifier in accordance with claim 24, wherein the processing circuit providing the processed output signal comprises a first filter arranged to filter the first digital error signal and the processed output signal is the filtered first digital error signal.

26. An amplifier according to claim 25, wherein the first filter comprises an averaging filter arranged such that the filtered error signal is the average of between 16 and 32 error signal samples.

27. An amplifier in accordance with claim 23, wherein the processing circuit providing the processed output signal comprises a first filter arranged to filter the first digital error signal, a second filter arranged to filter the second digital error signal, and a subtractor arranged to receive the filtered first and second digital error signals and generate a difference signal indicative of their difference.

28. An amplifier in accordance with claim 27, wherein the processing circuit providing the processed output signal comprises a third filter arranged to filter the difference signal, the processed output signal being the output from the third filter.

29. An amplifier according to claim 27, wherein the difference signal is a digital signal, and the second filter comprises an averaging filter arranged such that the filtered difference signal is the average of between 16 and 32 error signal samples.

30. An amplifier according to claim 1, further comprising an output stage arranged to receive at least one of the comparator and/or AND gate output signals and provide a single fault signal indicative of the presence or absence of a fault condition at the amplifier output.

31. An amplifier according to claim 30, wherein the output stage comprises an OR gate.

32. A fault detection circuit for an amplifier in accordance with claim 1.

33. An amplifier in accordance with claim 1, further comprising fault response circuitry arranged to respond to the signal indicative of the presence or absence of the fault condition.

34. A method of detecting a fault condition at an output of an amplifier of the type generating an output signal according to an input signal and comprising a feedback circuit arranged to provide a feedback signal indicative of the amplifier output signal, an error signal generating circuit arranged to receive the feedback signal and generate a digital error signal according to the feedback signal, and an output signal generating circuit arranged to generate the output signal and to receive the digital error signal and to adjust the output signal according to the digital error signal, the method comprising the steps of:
   monitoring the digital error signal; and
   determining the presence or absence of a fault condition at the amplifier output according to the digital error signal.

35. A method in accordance with claim 34, wherein the step of determining comprises the step of determining the presence or absence of a fault condition at the amplifier output according to the magnitude of the digital error signal.

36. A method in accordance with claim 34, wherein the step of monitoring comprises processing the digital error signal.

37. A method in accordance with claim 36, wherein said processing comprises filtering the digital error signal.

38. A method in accordance with claim 36, wherein said processing comprises generating a signal corresponding to the magnitude of the digital error signal or the filtered digital error signal.

39. A method in accordance with claim 36, wherein the step of determining comprises comparing the processed digital error signal with at least one predetermined threshold value, and using the results of the comparison as an indication of the presence or absence of a fault condition.

40. A method in accordance with claim 34, further comprising the steps of:
   monitoring the input signal to the amplifier; and
   determining the presence or absence of a fault condition at the amplifier output according to the digital error signal and the input signal.

41. A method in accordance with claim 40, wherein the step of determining comprises the step of determining the presence or absence of a fault condition at the amplifier output according to the magnitude of the digital error signal and the magnitude of the input signal.

42. A method in accordance with claim 41, wherein the step of determining comprises comparing the magnitude of the input signal with at least one predetermined threshold value.

43. A method of detecting a fault condition at an output of an amplifier of the type generating first and second output signals at first and second outputs according to an input signal and comprising first and second feedback circuits arranged to provide first and second feedback signals indicative of the first and second amplifier output signals respectively, first and second error signal generating circuits arranged to receive the respective feedback signals and generate first and second digital error signals according to the first and second feedback signals respectively, and first and second output signal generating circuits arranged to generate the first and second output signals and to receive the first and second digital error signals and to adjust the output signals according to the digital error signals, the method comprising the steps of:
   monitoring the first digital error signal;
   determining the presence or absence of a fault condition at an amplifier output according to the first digital error signal;
   monitoring the second digital error signal; and
   determining the presence or absence of a fault condition at an amplifier output according to the second digital error signal.

44. A method in accordance with claim 43, further comprising the steps of:
   monitoring the input signal to the amplifier;
   processing the first and second digital error signals to provide a processed signal dependent upon both the first and second digital error signals; and
   determining the presence or absence of a fault condition at an amplifier output according to the processed signal and the input signal.

45. A method in accordance with claim 44, wherein the processed signal is indicative of a difference between the first and second digital error signals.

* * * * *